United States Patent [19]

Tomimitsu

[11] Patent Number: 4,777,612
[45] Date of Patent: Oct. 11, 1988

[54] DIGITAL SIGNAL PROCESSING APPARATUS HAVING A DIGITAL FILTER

[75] Inventor: Yasuharu Tomimitsu, Tokyo, Japan

[73] Assignee: NEC Corporation, Tokyo, Japan

[21] Appl. No.: 657,910

[22] Filed: Oct. 5, 1984

[30] Foreign Application Priority Data

Oct. 5, 1983 [JP] Japan .................... 58-186545
Jan. 31, 1984 [JP] Japan .................... 59-16402

[51] Int. Cl.$^4$ .............................. G06F 7/38
[52] U.S. Cl. ................. 364/724.13; 364/724.16
[58] Field of Search ............ 364/724; 358/36, 37; 375/103; 128/901; 370/110.3

[56] References Cited

U.S. PATENT DOCUMENTS

| | | | |
|---|---|---|---|
| 3,883,727 | 5/1975 | Stuart et al. | 364/724 |
| 3,906,218 | 9/1975 | Nussbaumer | 364/724 |
| 4,011,438 | 3/1977 | Aufderheide et al. | 364/724 |
| 4,121,296 | 10/1978 | Snijders et al. | 364/724 |
| 4,388,693 | 6/1983 | Nakayama | 364/724 |
| 4,393,456 | 7/1983 | Marshall, Jr. | 364/724 |
| 4,407,018 | 9/1983 | Kanemasa | 364/724 |
| 4,483,009 | 11/1984 | Honda et al. | 364/724 |
| 4,598,368 | 7/1986 | Umemura | 364/724 |

FOREIGN PATENT DOCUMENTS

0131641 1/1985 European Pat. Off. ............ 364/724

Primary Examiner—Gary V. Harkcom
Assistant Examiner—Long Thanh Nguyen
Attorney, Agent, or Firm—Sughrue, Mion, Zinn, Macpeak, and Seas

[57] ABSTRACT

A digital signal processing apparatus with a rate-conversion function has at least two digital filters and a memory. A digital signal stored in the memory is selectively transferred to the at least two digital filters. These digital filters perform a filtering operation in parallel, and the results from each of the digital filters are alternately derived by a multiplexer. Thus, high-speed filtering can be executed. The memory temporarily stores a time-division-multiplexed signal which is sequentially read out of the memory and selectively transferred to the digital filters. Thus, a plurality of digital signals can be filtered by the same digital filters without an increase in hardware elements. Therefore, the digital filter section can be integrated in a single semiconductor chip. A shift register may be used as the memory, whereby a circuit arrangement of the digital filter section can be extremely simplified.

8 Claims, 6 Drawing Sheets

DIGITAL SIGNAL PROCESSING APPARATUS HAVING A DIGITAL FILTER

FIELD OF THE INVENTION

The present invention relates to a digital signal processing apparatus having a digital filter, and more particularly to a digital signal processing apparatus having a rate-conversion function in the filtering operation.

BACKGROUND OF THE INVENTION

In a typical digital signal processing technique an analog signal such as, an audio signal, an image signal, or the like, is converted to a digital signal by means of a sampling operation and a quantizing operation, and then processed by a digital filter, such as a finite impulse response (FIR) filter (a transversal filter or a non-recursive filter) which is well known in the art. An output of the digital filter is transferred to a digital-to-analog converter, which it is converted into an analog signal. The converted analog signal is taken out through a low pass filter, or the like.

A rate conversion is required to improve the signal-to-noise ratio or to decrease the burden on the low pass filter. This conversion is performed by, for example, interpolating new digital data between adjacent sampled digital data using the digital filter. For instance, if digital data is interpolated between consecutive samples of digital data, the number of sampler is doubled, and a two-times rate-conversion is achieved. However, a conventional digital filter having the rate-conversion function has a defect that high-speed filtering can not be performed since the interpolating operation is required.

Further, in order to process a plurality of digital signals, digital filters equal in number to the signals to be processed must be employed. Thus, a large quantity of hardware elements are required for digital-filtering. Therefore, a plurality of semiconductor chips, in each of which a digital filter circuit is independently formed, must be used.

A transversal (non-recursive) digital filter generally comprises a plurality of delay circuits, a plurality of multipliers and an adder. When this filter is produced as a semiconductor device, a read-write memory (RAM) is used as the delay circuits. Further, a read only memory (ROM) is used to store a plurality of coefficients for multiplications. In addition to these memories, a plurality of multiplier circuits and an adder circuit are used. Therefore, it is very hard to integrate a plurality of filters in a semiconductor chip.

An object of the present invention is to provide a digital signal processing apparatus having a digital filter in which the rate-conversion can be performed at a high speed.

Another object of the present invention is to provide a digital signal processing apparatus adaptable for filtering a plurality of digital signals (multi-channel signals) with a small number of hardware elements.

Still other object of the present invention is to provide a digital signal processing apparatus having a digital filter means formed on a semiconductor chip and performing a rate-conversion operation for at least two different digital signals in a multi-channel digital system.

SUMMARY OF THE INVENTION

A digital signal processing apparatus of the present invention comprises at least two digital filter circuits each executing a multiplication operation and an addition operation, a memory means for temporarily storing digital signals to be processed by the digital filters and for functioning as a delay means, a transferring circuit coupled to the memory means and to the digital filter circuits for selectively transferring the digital signals from the memory means to the digital filter circuits, and a multiplexing circuit coupled to output portions of the digital filter circuits for alternately deriving outputs from the digital filter circuits. The digital filter circuits are positioned in parallel with each other, and perform a filtering operation in parallel. The memory means has a capacity for storing at least two different digital signals, for example, sampling data and interpolating data, or first channel data and second channel data in a multi-channel system, or the like. A pair of random access memories, a pair of registers, a single shift register, or the like, may be used as the memory means. The memory means, digital filter circuits, transferring circuit, and multiplexing circuit can be integrated in the same semiconductor chip.

According to the present invention, the digital filter circuits are integrated in a semiconductor chip and are activated in parallel. If two digital filter circuits are employed, one is used to process the filtering operation for the odd numbered sampled data, while the other is used to process the filtering operation for the even numbered sampled data. The odd numbered sampled data and the even numbered sampled data are alternately stored in the memory means, and are selectively applied to the two digital filter circuits through the transferring circuit. These two digital filter circuits perform a filtering operation in parallel. Outputs of these two digital filter circuits are alternately selected and transferred through the multiplexing circuit.

Therefore, a high-speed filtering operation can be obtained. In particular, the present invention is useful for rate-conversion processing.

Further, in a multi-channel system, a plurality of digital signals are time-division-multiplexed and are sequentially stored in the memory means, and thereafter they are selectively applied to the digital filter circuits. Thus, the filter circuits can be used in common for the plurality of digital signals. Therefore, a filtering section is easily integrated in a single semiconductor chip even if a digital signal processing apparatus is used in a multi-channel system. Here, if a shift register is used as the memory means, data transmission to the filter circuits can be very much simplified as described hereinafter.

BRIEF DESCRIPTION OF THE DRAWINGS

FIGS. 3(*a*) and 3(*b*) are illustrations showing the known concept of the PCM signal rate-conversion operation;

DESCRIPTION OF THE PREFERRED EMBODIMENT OF THE PRESENT INVENTION

Figure 1:
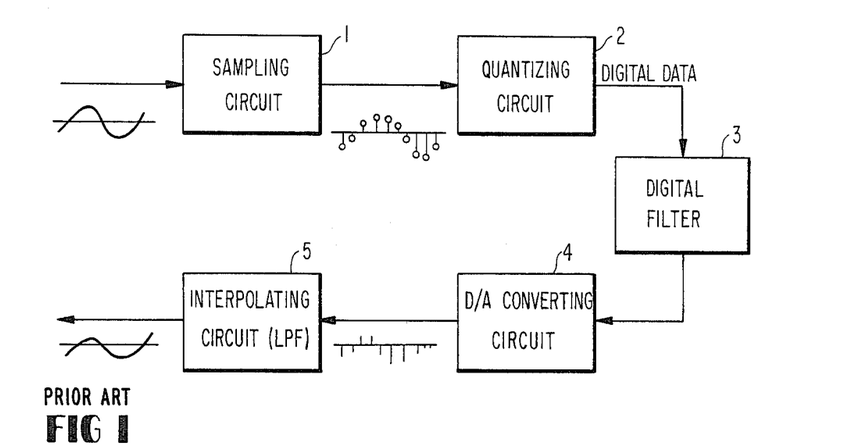
FIG. 1 is a block diagram showing a digital signal processing apparatus.

A typical conventional digital signal processing apparatus is, as shown in FIG. 1, composed of: a sampling circuit 1 which is responsive to an analog input signal to a Pulse Amplitude Modulation (PAM) signal; a quantizing circuit 2 which converts the output of the sampling circuit 1 into digital signals in the form of a series of binary codes digitally plotted along the amplitude axis of the PAM signal; a digital filter 3 which effects digital signal processing such as to shape the output of the quantizing circuit 2 into a desired spectrum; a D/A converter circuit 4 which converts the output of the digital filter 3 into an analog value; and an interpolator circuit 5, such as low pass filter, which obtains a desired analog signal.

Figure 2:
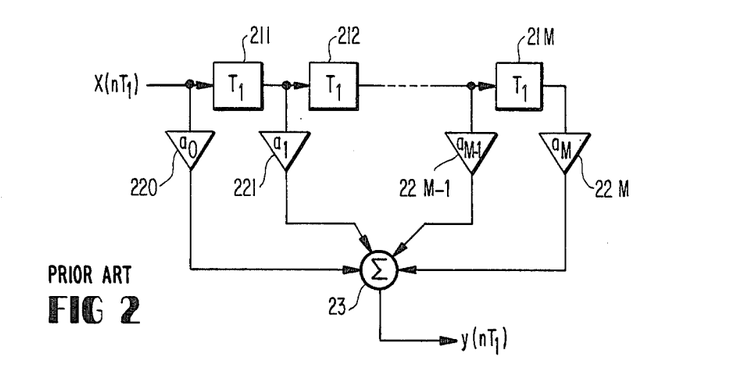
FIG. 2 is a block diagram of a prior art non-recursive digital filter employed in a conventional digital signal processing apparatus.

In the case where a non-recursive digital filter (a known transversal filter) is employed for the spectrum shaping operation, the input/output relationship between the input signal $x(nT_1)$ (a digital value) to the digital filter and the output signal $y(nT_1)$ (a digital value) from the digital filter at the time $nT_1$ is represented as follows:

$$y(nT_1) = \sum_{k=0}^{M} a_k x [(n - k)T_1] \quad (1)$$

where: n, M are positive integers; $T_1$ is a sampling period; and $a_k$ is a constant. The formula (1) includes three kinds of operations; that is, addition, multiplication and time delaying. The formula (1) can be carried out by a digital circuit arrangement such as that shown in FIG. 2. In the FIG. 2: the reference numerals 211 to 21M denote $T_1$ time-delay circuits; the numerals 220, 221, . . . , 22M−1, 22M denote multipliers having constants $a_0$, $a_1$, . . . , $a_{M-1}$, $a_M$ respectively; and the numeral 23 denotes an adder.

Figure 3:
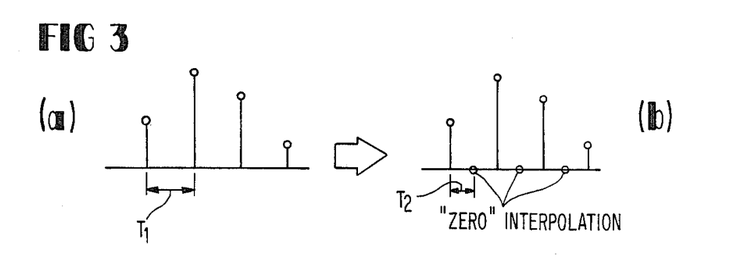

The following is a description of a non-recursive digital filter having a rate-conversion function which can be employed as the digital filter 3 shown in FIG. 1. The description will be for the case where the sampling rate is doubled to simplify the description. Assuming that the input to the filter is sampled digital data arriving at the sampling frequency $f_s = 1/T_1$ shown in FIG. 3(a), interpolation by zero data is effected as shown in FIG. 3(b), and the zero data are regarded as sampled values $x(nT_2)$ at the rate of the sampling frequency $2f_s$, where $T_2 = \frac{1}{2}f_s$. Assuming now that the input/output relationship of the digital filter is represented as follows:

$$y(nT_2) = \sum_{k=0}^{M} a_k x [(n - k)T_2]$$

when the sampled data (actual data) shown in FIG. 3(a) are applied to the input terminal, the term $x (n-k)T_2$, when k is an odd order, is zero. Therefore, in practice, the output signal $y(nT_2)$ can be obtained by calculating the term only when k is an even order. On the other hand, when interpolation is effected by the zero data, the output signal $y(nT_2)$ can be obtained by calculating the term only when k is an odd order.

Figure 4:
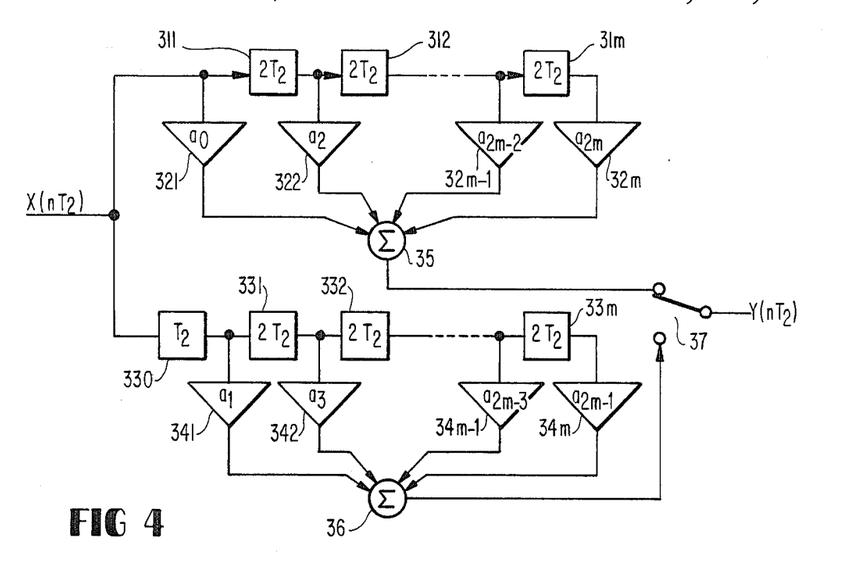
FIGS. 4 and 5 are block diagrams of a rate-conversion non-recursive digital filter which effects a double rate conversion operation on a single input according to a fundamental concept of the present invention.
Figure 5:
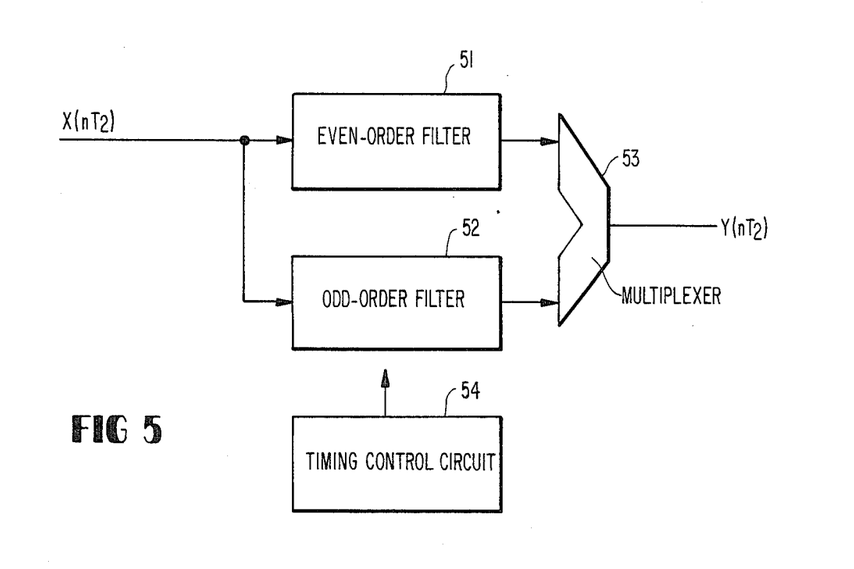

Accordingly, the non-recursive digital filter circuit with the rate-conversion function is equivalently represented by parallel filters such as those shown in FIG. 4, which figure shows a fundamental circuit of the present invention. This digital filter circuit includes an even-order filter having $2T_2$ time-delay circuits 311 to 31m, multipliers 321 to 32m, and an adder 35, an odd-order filter having a $T_2$ time-delay circuit 330, $2T_2$ time-delay circuits 331 to 33m, multipliers 341 to 34m, and an adder 36, and a selector 37. The digital filter is arranged such that a switch 37 is switched over at a rate of $2f_s$ such as to alternately output the results of the calculations carried out by the even-order filter and the odd-order filter, thereby obtaining a rate-converted output signal $y(nT_2)$ having a rate of $2f_s$. In the above, M is assumed to be 2m. This non-recursive digital filter can be constructed as shown in FIG. 5. The time sequence of the digital filter is as that shown in FIG. 6.

In FIG. 5, an input signal $x(nT_2)$ is input to both an even-order filter 51 and an odd-order filter 52. The respective outputs of the filters 51 and 52 are input to a multiplexer 53, which provides an output signal $y(nT_2)$ as its output. A timing control circuit 54 controls the timing of the even-order filter 51 and the odd-order filter 52.

Figure 6:
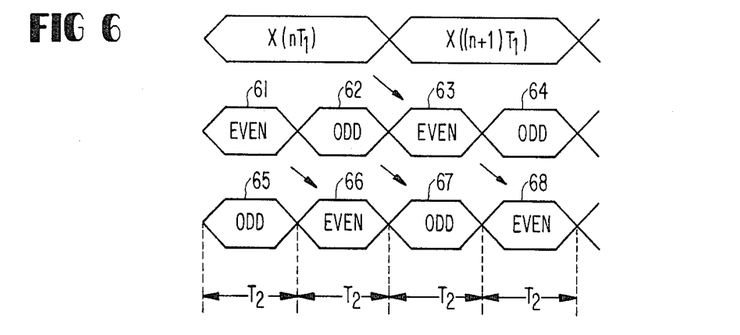
FIG. 6 is a timing chart showing the operation of the digital filter shown in FIG. 5.

As shown in FIG. 6, the respective results of an even-order calculation 61 and an odd-order calculation 62 in relation to, for example, an input signal $x(nT_1)$ are delivered as an even-order output 66 and an odd-order output 67 in relation to an output signal $y(nT_2)$. The same is the case with an even-order calculation 63 and an odd-order calculation 64 in relation to an input signal x (n+1), and therefore, the reference numerals 67 and 68 respectively denote the odd-order output and even-order output in an output signal $y(nT_2)$.

Incidentally, the above-described digital filter handles one-channel input signal. To effect a two-fold rate conversion operation on plural-channel input signals, it is, hitherto, disadvantageously necessary to provide a number of hardware units which are the channel-number times as large as that for one channel. Namely, many sets of filters 51 and 52 must be employed.

Accordingly, it is desired to provide a digital signal processing apparatus which makes it possible to realize a rate change operation for time-division multiplexed plural-channel input signals with a simple hardware.

To satisfy this desire, a digital signal processing apparatus comprising a memory circuit which stores, for a predetermined period of time, a plurality of N-channel PCM signals time-division multiplexed, N digital filters obtained by dividing an m-order non-recursive digital filter into N sections, and a switching circuit which selectively connects together the memory circuit and the N digital filters, wherein the i-th digital filter in the N digital filters is adapted to carry out multiplication with an (lN+i)th coefficient (l=0, 1, ...) and addition where i>m. A filtering operation is executed by switching over the switching circuit at an interval at which the PCM signals are transmitted such as to obtain N outputs, thereby effecting an N-times rate-recursive digital filter operation on the PCM signals.

Figure 7:
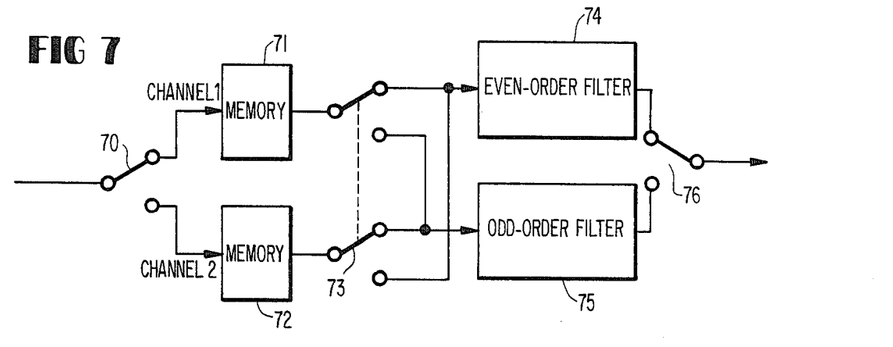
FIG. 7 is a block diagram of a rate-conversion non-recursive digital filter in accordance with an embodiment of the present invention.
Figure 8:
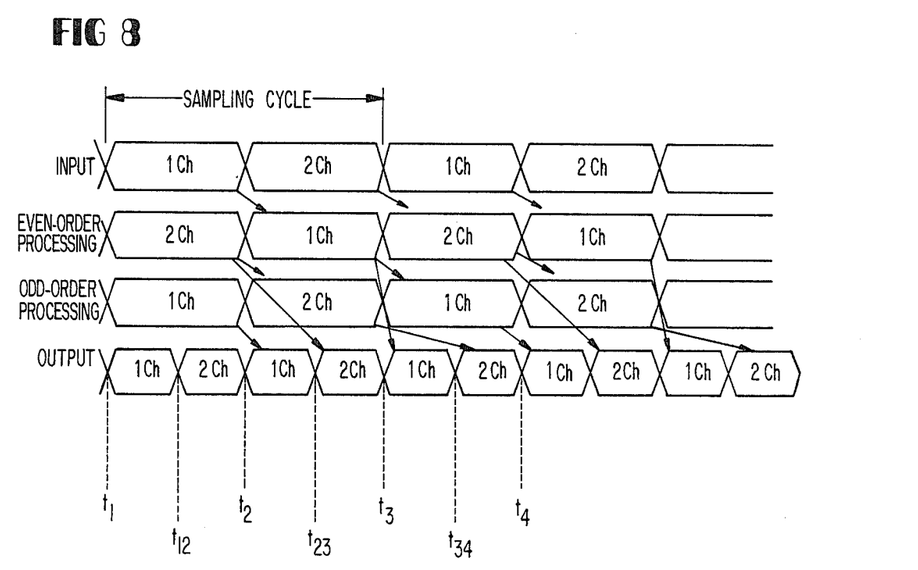
FIG. 8 is a timing chart showing the operation of the digital filter shown in FIG. 7.

FIG. 7 is a block diagram of one embodiment of the present invention, while FIG. 8 is a timing chart showing the operation of the embodiment shown in FIG. 7. In this embodiment, time-division multiplexed two-channel input signals are alternately input for the channel 1 and the channel 2. These signals are properly selected by a selector 70 and are written into respective memories 71, 72 which are used as delay circuit means (311 and 31$m$, 330, 331, ... 33$m$ in FIG. 4). Two digital filters 74 and 75 are provided, each comprising a ROM for storing coefficients, a multiplier, and an arithmetic circuit for addition. At the timing (between the time $t_2$ and the time $t_3$) subsequent to the timing (between the time $t_1$ and the time $t_2$) when the channel-1 data has been written, the written channel-1 data is delivered to an even-order digital filter 74 through a selector 73, and a calculation output is obtained from the filter 74. At the same timing, the channel-2 data written before the time $t_1$ is delivered to an odd-order digital filter 75 through the selector 73, and a calculation output is obtained from the filter 75. The respective outputs of the even-order filter 74 and the odd-order filter 75 are delivered in a time-division manner while being, further, properly selected by a selector (a multiplexer) 76 at the time $t_{34}$ within the subsequent timing (between the time $t_3$ and the time $t_4$). At the timing between the time $t_2$ and the time $t_3$, the channel-2 data is written into the memory 72 through the selector 70 to renew the contents of the memory 72. At the time $t_3$, the selector 73 is switched over such that the channel-1 data is delivered to the odd-order filter 75 and the channel-2 data is delivered to the even-order filter 74, thereby obtaining the respective outputs of the filters 75 and 74. The selector 76 is switched over at the time $t_{45}$ such that the respective outputs of the even-order filter 74 and the odd-order filter 75 are delivered in a time-division manner. These operations are repeated.

Thus, a rate-conversion operation and a two-channel multi-operation can be processed at a high speed with only two filters 74 and 75. These filters are not required to include a delay means and may comprise a multiplication means and an addition means. The respective circuits 71, 72, 74 and 75 and the selectors 70, 73 and 76 in FIG. 7 can be easily integrated in a single semiconductor chip.

With the digital filter shown in FIG. 7 it is possible to efficiently subject two-channel PCM digital signals to a two-fold rate conversion operation by allowing the two-channel signals to multiplexly use filters which are respectively provided for even-order shift steps and odd-order shift steps.

Figure 9:
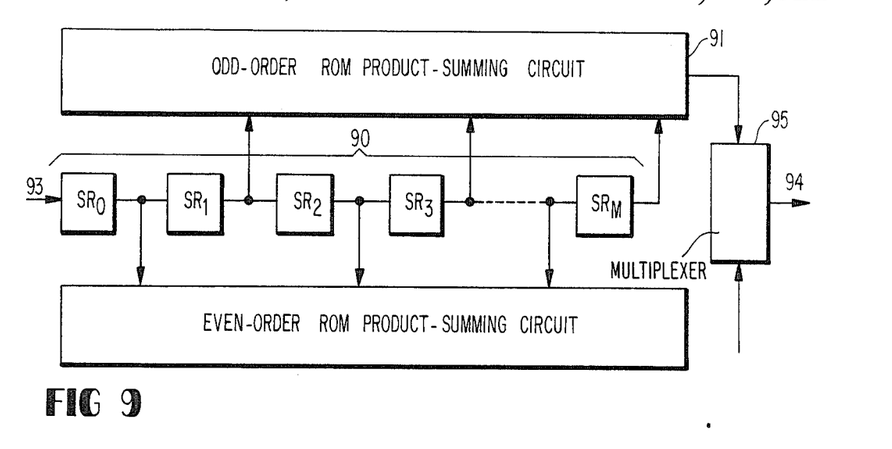
FIG. 9 is a block diagram of a digital filter having an array multiplication method according to another embodiment of the present invention.

FIG. 9 shows another embodiment of the present invention which adopts an Array multiplication method. The Array multiplication method employs a ROM product-summing circuit which includes a ROM previously storing products of respective bits and accessed by input digital signals and a circuit for repeatedly executing shift and addition operations of the outputs of the ROM. The digital filter of FIG. 9 uses an odd-order ROM product-summing circuit 91 and an even-order ROM product-summing circuit 92 instead of the odd-order digital filter 74 and the even-order digital filter 75 in FIG. 7, and uses a shift register 90 instead of memory circuits 71 and 72 in FIG. 7. The shift register 90 works as a delay means and includes M stages SR0 through SRM. Time-division multiplexed two-channel signals 93 are directly applied to the first stage SR0 of the shift register 90, and therefore the selector 70 of FIG. 7 is not required. The outputs of the respective stages SR0 to SRM of the shift register 90 are alternately output to the odd-order ROM product-summing circuit 91 and the even-order ROM product-summing circuit 92, whereby the two-channel signals are distributed to the odd-order shift steps and the even-order shift steps. The output of the odd-order ROM product-summing circuit 91 and the output of the even-order ROM product-summing circuit 92 are alternately derived by a multiplexer 95, thereby obtaining a rate-converted output 94.

Figure 10:
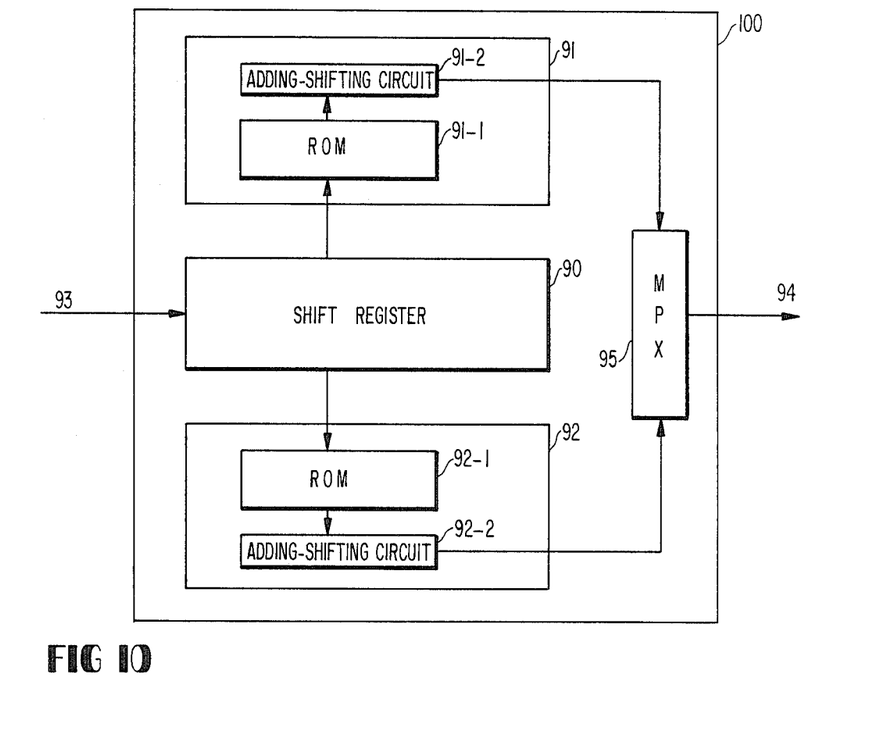
FIG. 10 is a block diagram showing a layout pattern of FIG. 9.

FIG. 10 is a block diagram showing a layout pattern for the circuit of FIG. 9. The shift register 90 for delaying input signals is disposed on a semiconductor chip 100 between the odd-order ROM product-summing circuit 91 and the even-order ROM product-summing circuit 92 which are respectively disposed on the upper and lower sides of the shift register 90 such that, for example, 16 outputs of the shift register are alternately distributed upwardly and downwardly. In the ROM product-summing circuits 91 and 92, ROM's 91-1 and 92-1 storing multiplied data are respectively disposed on the upper and lower sides of the shift register 90 as viewed in FIG. 10. The products obtained by the ROM's 91-1 and 92-1 are transferred up and down, respectively, to shifting and adding circuits 91-2 and 92-2, and the results of addition are sent to a multiplexer 95, disposed on one side of the shift register 90.

Thus, the shift register 90 is disposed in the center, and the ROM product-summing circuits 91 and 92, each comprised of a ROM 91-1, 92-1 and a shifting and adding circuit 91-2, 92-2 are respectively disposed on opposite sides of the shift register 90 such that the outputs of the shift register are alternately delivered to the circuits on both sides of the shift register 90, whereby the wiring region is reduced, thus advantageously enabling a reduction in area of the semiconductor device. In other words, it is possible to realize a low-cost and high-performance rate-conversion digital filter.

Figure 11:
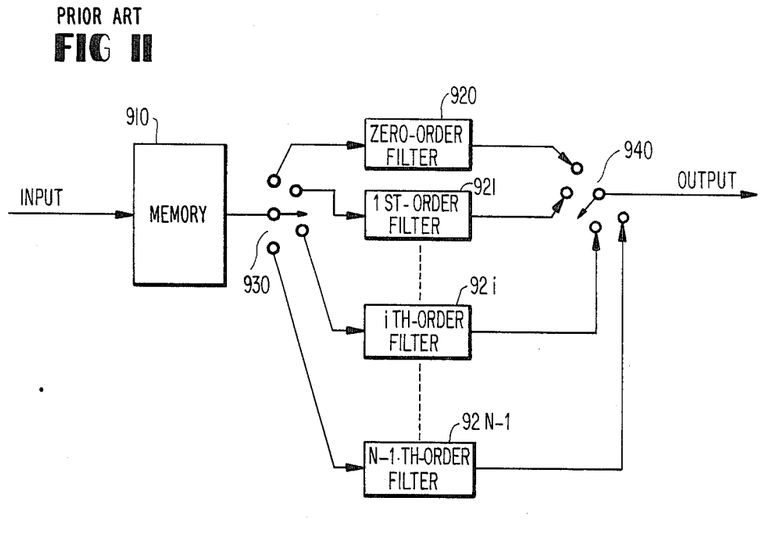
FIG. 11 is a block diagram of a prior art rate-conversion non-recursive digital filter which effects an n-times rate conversion operation on a single input.

In the case where time-division multiplexed N-channel input signals are subjected to an N-times sampling rate conversion operation, it is also possible to realize a digital signal processing apparatus according to a principle similar to the above as follows. FIG. 11 shows a conventional non-recursive digital filter employed to effect an N-times rate conversion operation on a single input. The number of zero-data interpolations is N-1. When actual data are input and stored in a memory 910, filtering is carried out on only the 0th, Nth, 2Nth ... data, respectively. At the subsequent timing, calculation is carried out on only the first (N+1)th ... data. Thereafter, further calculations are carried out in a similar manner. Assuming that the (lN+1)th data (l=0, 1 ..., $0 \leq i \leq N-1$) is calculated by the i-order filter, after the actual data are input, the respective outputs of the 0-order filter 920, the first-order filter 921 ..., the i-order filter 92$i$ ... the (N−1)-order filter 92N−1 are successively input and output by the selectors 930, 940, thereby making it possible to obtain an output signal changed such as to have an N-times sampling rate.

Figure 12:
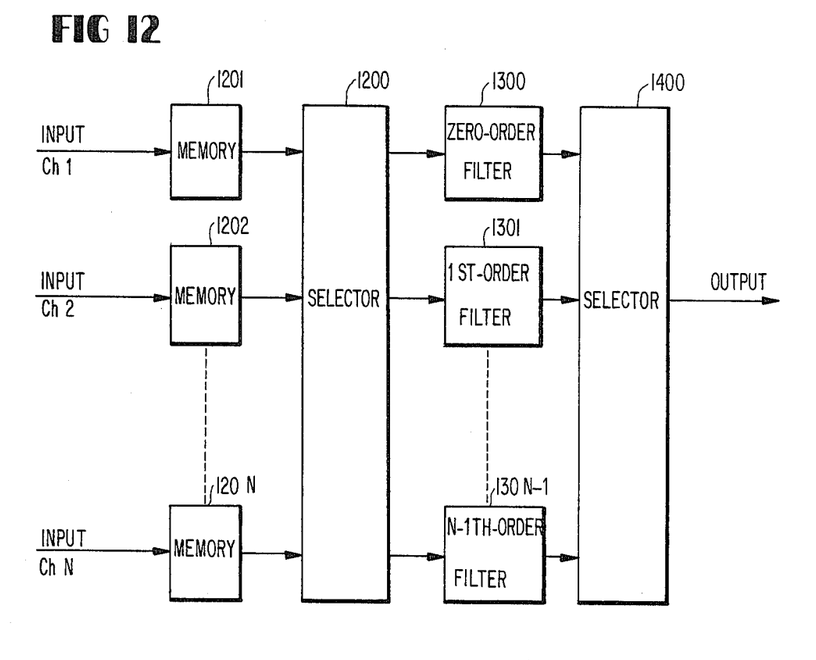
FIG. 12 is a block diagram of a rate-conversion non-recursive digital filter in accordance with a still other embodiment of the present invention which effects an N-times rate conversion operation on an N-channel input.
Figure 13:
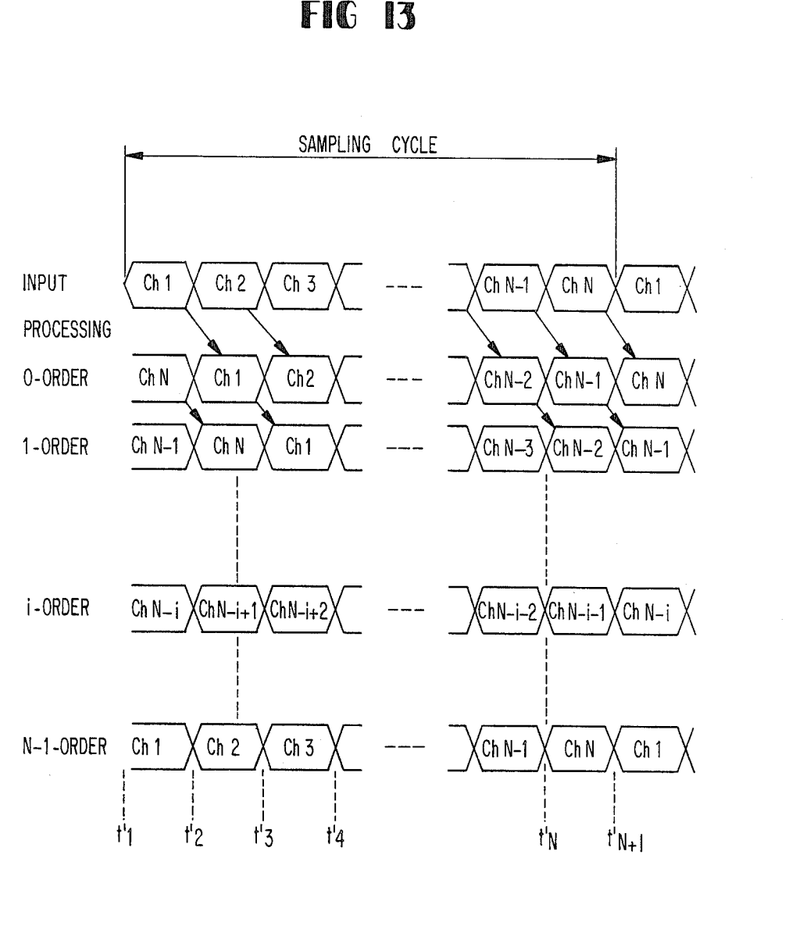
FIG. 13 is a timing chart showing the operation of the digital filter shown in FIG. 12.

Multiplexly using these filters makes it possible to effect a rate conversion operation on time-division multiplexed N-channel input signals. FIG. 12 is a block diagram of a third embodiment of the rate-conversion non-recursive digital filter for use in the above-described case, while FIG. 13 is a timing chart showing the operation of the digital filter shown in FIG. 12. Since time-division multiplexed N-channel input signals are successively input in the order, channel 1, channel 2, ..., channel N, these signals are written into memories 1201 to 120N which correspond to the respective channels. At the timing (between the time $t_2'$ and the time $t_3'$) subsequent to the timing (between the time $t_1'$ and the time $t_2'$) when the channel-1 data has been written, the written channel-1 data is delivered to the 0-order filter 1300 through a selector 1200, and the data of channel N, ..., channel i, ..., channel 2 which have been written before the time $t_1'$ are respectively delivered through the selector 1200 to a first-order filter 1301, ..., an (N−i+1)-order filter 130N−i+1, ..., an (N−1)-order filter (1301 to 130N−1), and calculation outputs are obtained therefrom. Then, a selector 1400 is switched at the rate 1/N of the sampling rate such that the respective calculation outputs of the 0-order filter to the (N−1)-order filter are delivered in a time-division manner. At the same timing (between the time $t_2'$ and the time $t_3'$), the channel-2 data is written into the memory 1202 to renew the contents thereof. At the time $t_3'$, the selector 1200 is switched over such that the channel-1 data is delivered to the first-order filter 1301, and in the similar manner, the data of the channel N, ..., the channel i, ..., the channel 2 are respectively delivered through the selector 1200 to the second-order filter 1302, ..., the (N−i+2)-order filter 130N−i+2, ..., the 0-order filter 1300, thus obtaining calculation outputs thereof. Then, the selector 1400 is switched over at the rate of 1/N of the sampling rate such that the respective calculation outputs of the first-order filter to the (N−1)-order filter and the 0-order filter are delivered in a time-division manner. Thereafter, the operations are successively repeated in the similar manner. Thus, according to the embodiment, it is possible to realize a rate-conversion digital filtering for time-division multiplexed plural-channel PCM signals with a simple hardware design.

What is claimed is:

1. A digital signal processing apparatus processing a first digital signal of a first channel and a second digital signal of a second channel which are applied thereto in a time-division manner comprising:
   an even-order digital filter;
   an odd-order digital filer;
   first means for receiving the first digital signal at a first timing;
   second means for receiving the second digital signal at a second timing subsequent to said first timing;
   third means coupled to said even-order digital filter and said first means for entering the first digital signal into said even-order digital signal at the second timing, said even-order digital filter performing a first filter operation on said first digital signal at the second timing;
   fourth means coupled to said even-order digital filter and said second means for entering the second digital signal into said even-order digital filter at a third timing subsequent to said second timing, said even-order digital filter performing a second filter operation on said second digital signal at the third timing;
   fifth means coupled to said odd-order digital filter and said first means for entering the first digital signal into said odd-order digital filter at said third timing, said odd-order digital filter performing a third filter operation on said first digital signal at the third timing; and
   output means coupled to said even-order digital filter and said odd-order digital filter for outputting a result of the first filter operation from said even-order digital filter at the third timing, outputting a result of the third filter operation from said odd-order digital filter in a first period of a fourth timing subsequent to said third timing, and outputting a result of the second filter operation from said even-order digital filter in a second period subsequent to said first period of said fourth timing.

2. An apparatus as claimed in claim 1, wherein said first means includes a first memory working as a delay circuit, said second means including a second memory working as a delay circuit.

3. An apparatus as claimed in claim 1, wherein said first means and said second means consist of a single shift register having a plurality of shift stages, even-order shift stages being coupled to said even-order digital filter, and odd-order shift stages being coupled to said odd-order digital filter.

4. An apparatus as claimed in claim 3, wherein each of said even-order digital filter and said odd-order digital filter includes a memory for storing multiplied data and a shifting and adding circuit.

5. An apparatus as claimed in claim 1, wherein said output means includes a multiplexer which sequentially outputs first the result of the first filter operation, then the result of the third filter operation and lastly the result of the second filter operation.

6. A digital signal processing apparatus having a two-fold rate conversion function for two channels comprising a shift register receiving a first digital signal from a first channel and a second digital signal from a second channel in a time-division manner and having a plurality of shift stages which alternately shifts the received first digital signal and the second digital signal, an even-order digital filter coupled to even-order shift stages and performing a filter operation on outputs of the even-order shift stages, an odd-order digital filter coupled to odd-order shift stages and performing a filter operation on outputs of the odd-order shift stages, and a multiplexer coupled to said even-order digital filter and said odd-order digital filter and alternately outputting a result of the filter operation of said even-order digital filter and a result of the filter operation of said odd-order digital filter.

7. An apparatus as claimed in claim 6, wherein said even-order digital filter and said odd-order digital filter are positioned rightwardly and leftwardly of said shift register, respectively.

8. An apparatus as claimed in claim 6, wherein the filter operation of said even-order digital filter is performed in parallel with that of the odd-order digital filter and synchronous with a shift operation of said shift register.

* * * * *

UNITED STATES PATENT AND TRADEMARK OFFICE
CERTIFICATE OF CORRECTION

PATENT NO. : 4,777,612
DATED : October 11, 1988
INVENTOR(S) : Yasuharu TOMIMITSU It is certified that error appears in the above-identified patent and that said Letters Patent is hereby corrected as shown below:

COLUMN 7, LINE 54    Delete "filer" and insert --filter--.

Signed and Sealed this

Twenty-third Day of May, 1989

Attest:

DONALD J. QUIGG

Attesting Officer

Commissioner of Patents and Trademarks